United States Patent
Yang

(10) Patent No.: US 9,865,707 B2
(45) Date of Patent: Jan. 9, 2018

(54) FABRICATING METHOD OF A STRAINED FET

(71) Applicant: UNITED MICROELECTRONICS CORP., Hsin-Chu (TW)

(72) Inventor: Po-Yu Yang, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 5 days.

(21) Appl. No.: 14/813,127

(22) Filed: Jul. 30, 2015

(65) Prior Publication Data

US 2017/0033198 A1  Feb. 2, 2017

(51) Int. Cl.
| | |
|---|---|
| *H01L 21/336* | (2006.01) |
| *H01L 29/66* | (2006.01) |
| *H01L 21/324* | (2006.01) |
| *H01L 21/31* | (2006.01) |
| *H01L 21/02* | (2006.01) |
| *H01L 21/265* | (2006.01) |
| *H01L 29/165* | (2006.01) |
| *H01L 21/8238* | (2006.01) |
| *H01L 29/78* | (2006.01) |

(52) U.S. Cl.
CPC .. *H01L 29/66795* (2013.01); *H01L 21/02636* (2013.01); *H01L 21/265* (2013.01); *H01L 21/31* (2013.01); *H01L 21/324* (2013.01); *H01L 21/823821* (2013.01); *H01L 29/165* (2013.01); *H01L 29/66803* (2013.01); *H01L 29/7848* (2013.01)

(58) Field of Classification Search
CPC ............. H01L 29/66795; H01L 29/785; H01L 29/165; H01L 29/7848; H01L 29/7851; H01L 21/823431; H01L 29/66545; H01L 27/0886; H01L 29/6681; H01L 21/02532; H01L 21/30604; H01L 21/76224
USPC .......................................................... 438/283
See application file for complete search history.

(56) References Cited

U.S. PATENT DOCUMENTS

| | | | | |
|---|---|---|---|---|
| 7,074,686 | B2 * | 7/2006 | Bedell | H01L 21/02378 |
| | | | | 257/E21.129 |
| 7,892,905 | B2 | 2/2011 | ong | |
| 7,977,221 | B2 * | 7/2011 | Ninomiya | H01L 21/76243 |
| | | | | 257/E21.103 |
| 9,024,368 | B1 * | 5/2015 | Yu | H01L 29/7848 |
| | | | | 257/288 |
| 2013/0183820 | A1 * | 7/2013 | Hiyoshi | H01L 21/3065 |
| | | | | 438/589 |
| 2013/0221433 | A1 * | 8/2013 | Molin | H01L 21/823487 |
| | | | | 257/330 |
| 2015/0194524 | A1 * | 7/2015 | Hu | H01L 29/7848 |
| | | | | 257/409 |
| 2015/0214338 | A1 * | 7/2015 | Cheng | H01L 29/66795 |
| | | | | 257/194 |

(Continued)

*Primary Examiner* — Vu A Vu
(74) *Attorney, Agent, or Firm* — Winston Hsu

(57) ABSTRACT

A fabricating method of a strained FET includes providing a semiconductive layer having a gate structure disposed thereon, wherein an epitaxial layer is embedded in the semiconductive layer aside the gate structure. Later, an element supply layer is formed to contact the epitaxial layer, wherein the element supply layer and the epitaxial layer have at least one identical element besides silicon. Finally, a thermal process is performed to drive the element into the epitaxial layer.

10 Claims, 6 Drawing Sheets

(56) References Cited

U.S. PATENT DOCUMENTS

2015/0279995 A1* 10/2015 Maeda ................ H01L 29/7848
257/192

* cited by examiner

FABRICATING METHOD OF A STRAINED FET

BACKGROUND OF THE INVENTION

1. Field of the Invention

The present invention relates to a method of fabricating a strained FET, and more particularly, to a method of increasing stress in an FET.

2. Description of the Prior Art

Reductions in the size and inherent features of semiconductor devices such as field-effect transistors (FETs) have enabled continued improvements in speed, performance, density, and cost per unit function of integrated circuits over the past few decades. In accordance with a design of the FET and one of the inherent characteristics thereof, modulating the length of a channel region underlying a gate between a source and a drain of an FET alters a resistance associated with the channel region, thereby affecting the performance of the FET.

To further enhance the performance of FETs, stresses may be introduced in the channel region of an FET to improve its carrier mobility. Stress in the FET induced by conventional methods cannot, however, fulfill speed demands required of modern FETs. Therefore, there are continued efforts to enhance stress in FETs to achieve greater carrier mobility.

SUMMARY OF THE INVENTION

According to a preferred embodiment of the present invention, a fabricating method of a strained FET includes providing a semiconductive layer having a gate structure disposed thereon, wherein an epitaxial layer is embedded in the semiconductive layer aside the gate structure. Later, an element supply layer is formed to contact the epitaxial layer, wherein the element supply layer and the epitaxial layer have at least one identical element besides silicon. Finally, a thermal process is performed to drive the element into the epitaxial layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 6 depict a fabricating method of a strained FET according to a first preferred embodiment of the present invention, wherein:

FIG. 2 is a cross sectional view taken along line AA' in FIG. 1;

FIG. 3 to FIG. 6 continue from the embodiment shown in FIG. 2;

DETAILED DESCRIPTION

Figure 1:
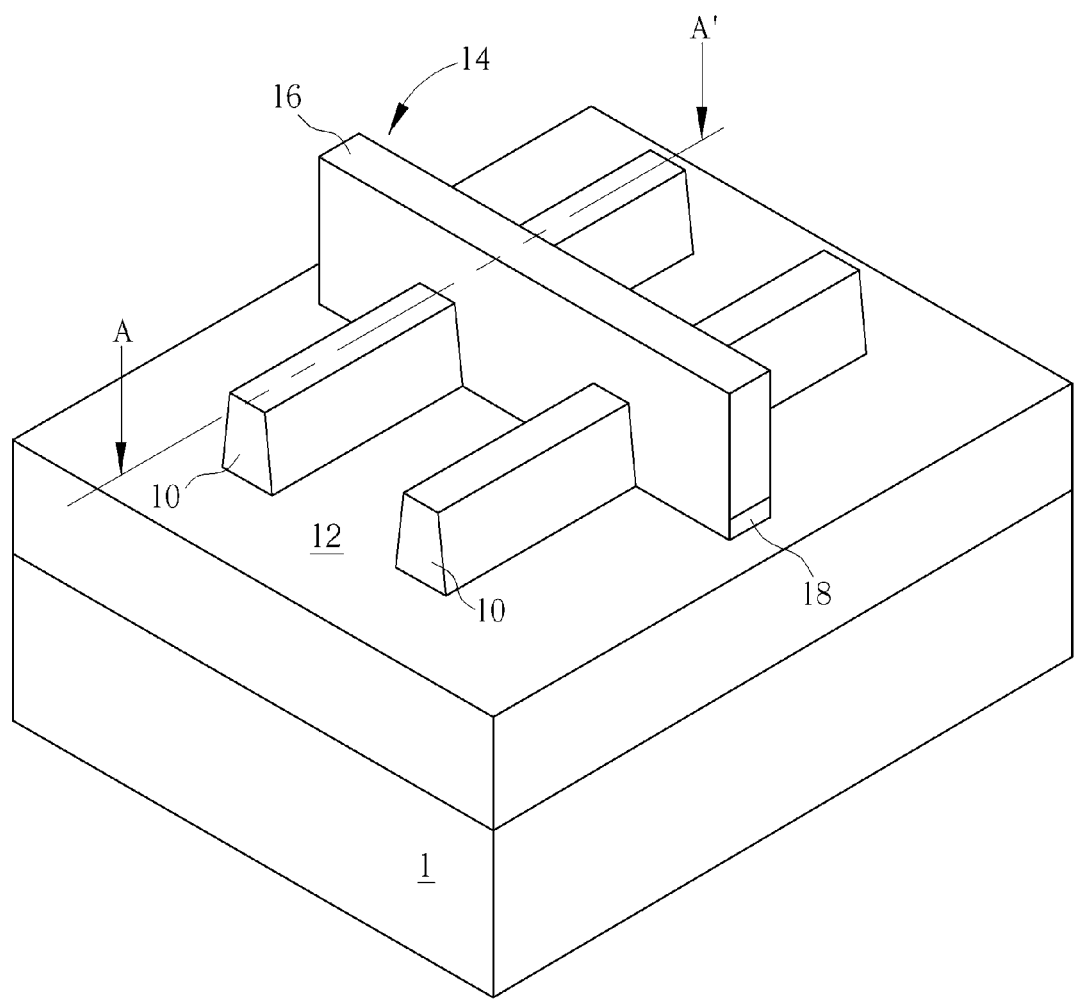
Figure 2:
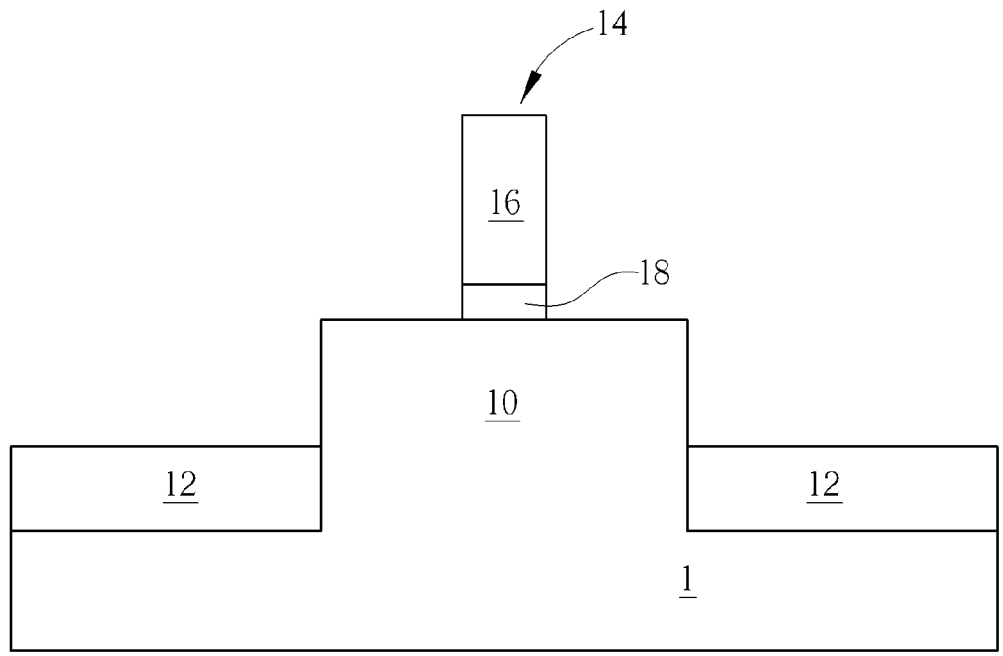

FIG. 1 to FIG. 6 depict a fabricating method of a strained FET according to a first preferred embodiment of the present invention. FIG. 2 is a cross sectional view taken along line AA' in FIG. 1.

Please refer FIG. 1 and FIG. 2. A semiconductive layer 10 is provided. The semiconductive layer 10 may be a fin. The fin may be formed by a substrate 1. There can be numerous semiconductive layers 10 formed by the substrate 1. A STI 12 can be disposed between two adjacent semiconductive layers 10. A gate structure 14 disposed on and crosses the semiconductive layers 10. The gate structure 14 includes a gate electrode 16 and a gate dielectric layer 18. In the present invention, if the semiconductive layer is a fin, a strained FET formed by the semiconductive layer will be a FinFET (Fin Field-Effect Transistor).

In other example, the semiconductive layer 10 may be a planar SOI substrate, a planar silicon substrate a germanium substrate, a planar gallium arsenide substrate, a planar silicon germanium substrate, a planar indium phosphide substrate, a planar gallium nitride substrate, or a planar silicon carbide substrate. If the semiconductive layer is a planar substrate, a strained FET formed by the semiconductive layer will be a planer FET.

Figure 3:
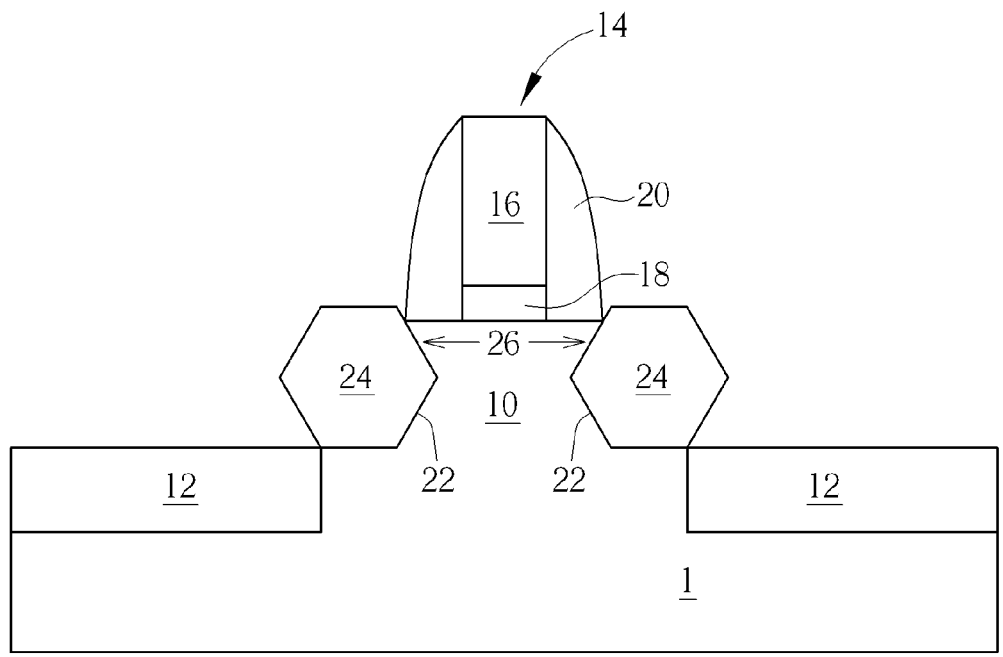

As shown in FIG. 3, a spacer 20 is formed at two side of the gate structure 14. Then, the semiconductive layer 10 is etched to formed two recesses 22 in the semiconductive layer 10 at two sides of the gate structure 14. Later, an epitaxial layer 24 is epitaxially grown to respectively fill up the recesses 22. A channel region 26 is defined between the epitaxial layer 24 in the two recesses 22. In other words, the epitaxial layer 24 is embedded in the semiconductive layer 10 and the epitaxial layer 24 is at two sides of the gate structure 14. The epitaxial layer 24 is crystallized. The epitaxial layer 24 is preferably grown at 800° C., but not limited to this temperature. If the FET to be formed is a p-type FET, the epitaxial layer 24 is SiGe. If the FET to be formed is an n-type FET, the epitaxial layer 24 may be SiC, SiCP or SiP.

Figure 4A:
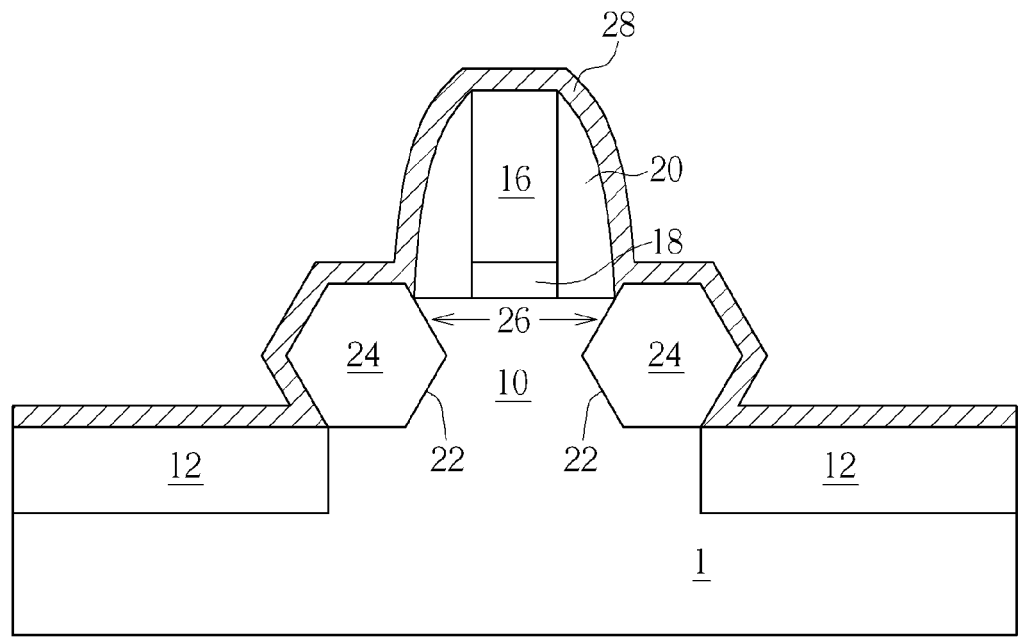
FIG. 4A is a method of forming an element supply layer according to a preferred embodiment.

As shown in FIG. 4A, an element supply layer 28 is formed to contact the epitaxial layer 24; more specifically, the element supply layer 28 conformally covers the gate structure 14, the spacer 20, the semiconductor layer 10 and the epitaxial layer 24. The element supply layer 28 may be formed quickly by a deposition process at a lower temperature, so the element supply layer 28 is amorphous. If the FET to be formed is a p-type FET, the element supply layer 28 is SiGe, or Ge. If the FET to be formed is an n-type FET, the element supply layer 28 may be C, SiC, SiCP or SiP.

Figure 4B:
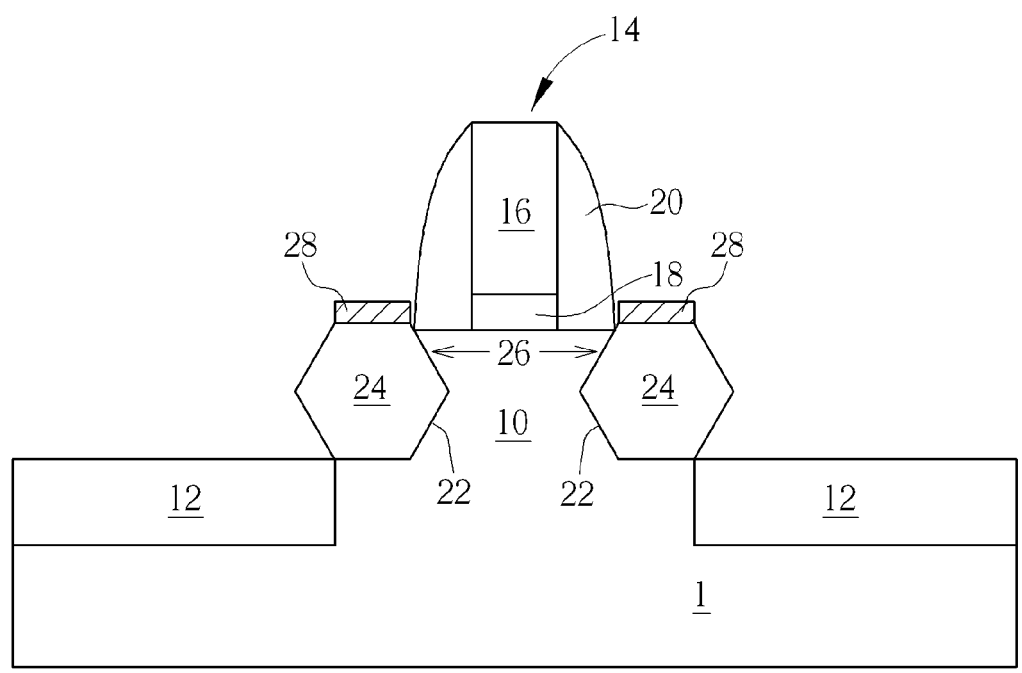
FIG. 4B is a method of forming an element supply layer according to another preferred embodiment.

According to another example, as shown in FIG. 4B, the element supply layer 28 can be formed selectively and only contact the epitaxial layer 24. In detail, the element supply layer 28 is formed slowly by an epitaxial growth process at a higher temperature, so the element supply layer 28 is crystallized. Similarly, if the FET to be formed is a p-type FET, the element supply layer 28 is SiGe, or Ge. If the FET to be formed is an n-type FET, the element supply layer 28 may be C, SiC, SiCP or SiP.

It is noteworthy that the element supply layer 28 and the epitaxial layer 24 have at least one identical element besides silicon. For example, if the FET to be formed is a p-type FET, the epitaxial layer 24 can be SiGe, and the element supply layer 28 can be Ge. The identical element in this case is Ge. If the FET to be formed is an n-type FET, the epitaxial layer 24 can be SiC, and the element supply layer 28 may be SiC. The identical element in this case is C. There can be other possible combinations of material of the epitaxial layer 24 and the element supply layer 28, which are not limited to the example illustrated above.

Figure 5:
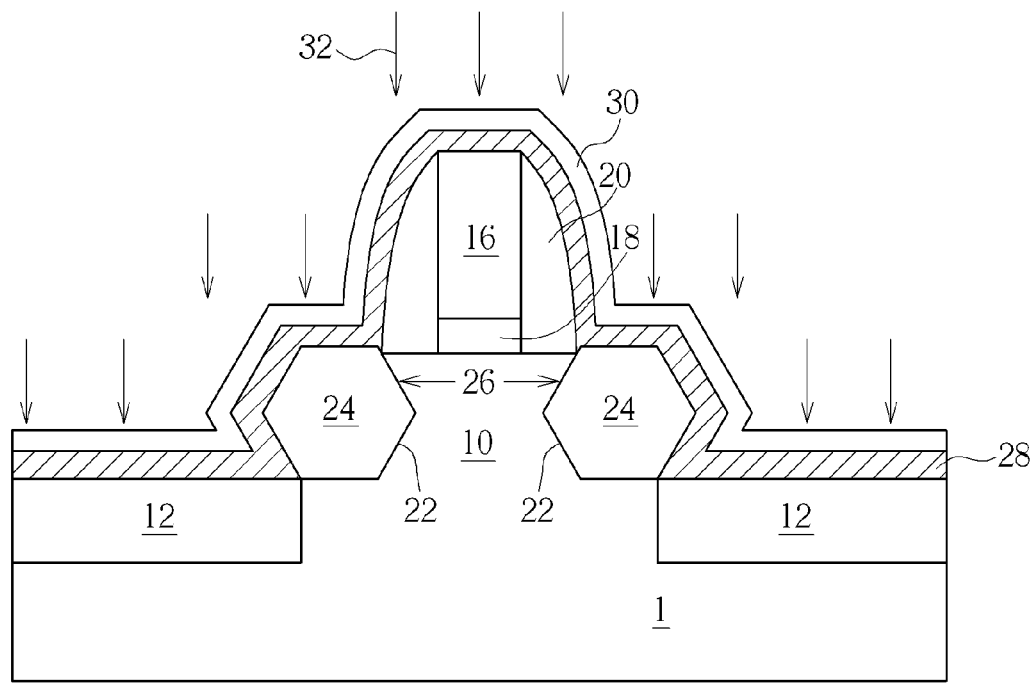

As shown in FIG. 5, a cover layer 30 is formed optionally to cover the element supply layer 28. The cover layer 30 may be $SiO_2$, SiN, TiN or SiCN. In other examples, the cover layer 30 can be omitted. The cover layer 30 can serve as an anti-reflection coating. Additionally, the cover layer 30 can work like a lid to keep the elements in the element supply layer 28 from evaporating during the following thermal process.

Please still refer to FIG. 5. A thermal process 32 is performed on the element supply layer 28 to drive the element into the epitaxial layer 24. The thermal process 32 includes rapid thermal anneal, furnace anneal, condensation reaction or laser anneal. In a preferred embodiment, the thermal process 32 may be laser anneal, which is an ultrafast and low thermal budget process. The high temperature annealing region is restricted to thin layers while keeping underlying layers at low temperature. The solid solubility of the element in the epitaxial layer 24 can be increased by using the laser anneal.

The thermal process 32 can optionally contain oxygen. If the thermal process 32 contains oxygen, it is better to omit the cover layer 30, therefore the element supply layer 28 will be oxidized and the element in the element supply layer 28 will be driven into the epitaxial layer 24. After the thermal process, the specific element in the epitaxial layer 24 is increased. For instance, if the FET to be formed is a p-type FET, the epitaxial layer 24 is SiGe, the element supply 28 layer is Ge, and the concentration of Ge in the epitaxial layer 24 is increased after the thermal process. Furthermore, the increased Ge in the epitaxial layer 24 is at substitutional sites, i.e. the compressive stress of the channel region 26 is increased after the thermal process. If the FET to be formed is an n-type FET, the epitaxial layer 24 is SiC, the element supply layer 28 is SiC, and the concentration of C in the epitaxial layer 24 is increased after the thermal process. The increased C in the epitaxial layer 24 is at substitutional sites. Therefore, the tensile stress of the channel region 26 is increased after the thermal process.

Figure 6:
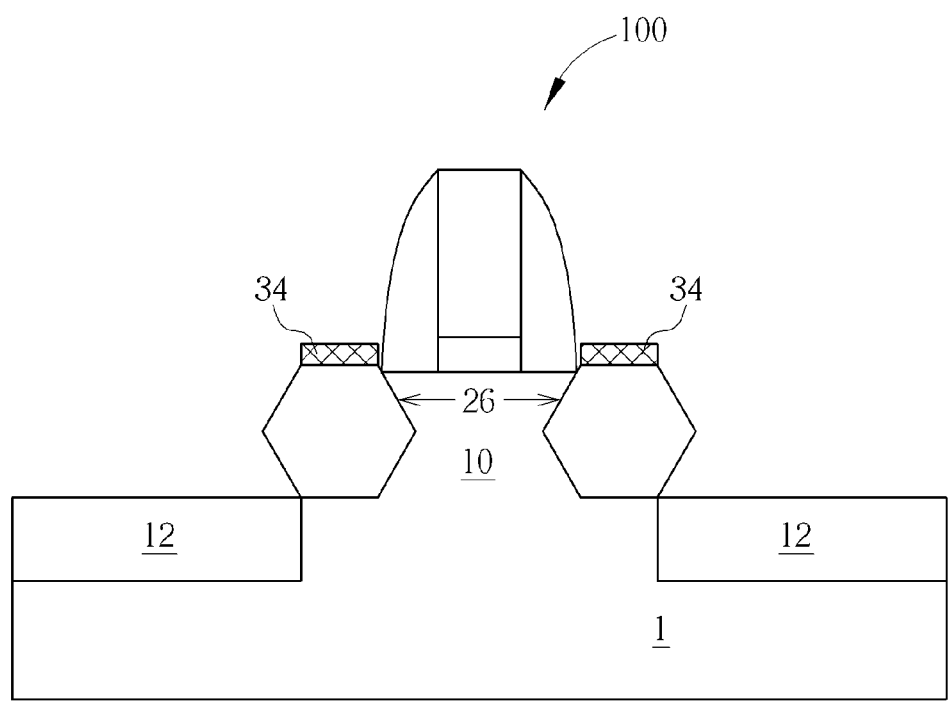

As shown in FIG. 6, the cover layer 30 and the element supply layer 28 are removed completely. The cover layer 30 and the element supply layer 28 may be removed by a wet etching process. Later, a source/drain doping region (shown by dots) can be formed by implanting dopants into the epitaxial layer 24 followed by an anneal process. After that, a cap layer 34 is formed on the epitaxial layer 24. The cap layer 34 is preferably formed by an epitaxial growth process and extends from the epitaxial layer 24. At this point, a strained FinFET 100 of the present invention is completed.

In another example, the source/drain doping region can be formed before the thermal process illustrated in FIG. 5. For instance, after the epitaxial layer 24 is formed and before the element supply layer 28 is formed, the source/drain doping region can be formed. Thereafter, during the thermal process illustrated in FIG. 5, the dopants for the source/drain doping region can be activated along with driving in the element.

The fabricating method of a strained FET can also be used to form a strained planar FET. This comprises using a planar substrate as the semiconductive layer.

Figure 7:
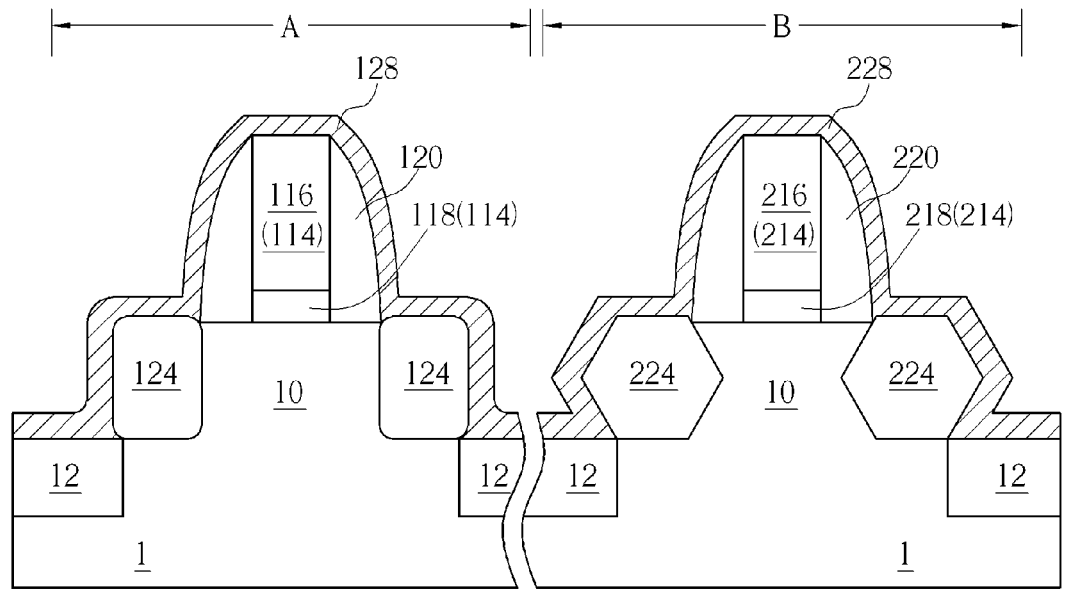
FIG. 7 to FIG. 9 depict a fabricating method of a strained CMOS device.
Figure 8:
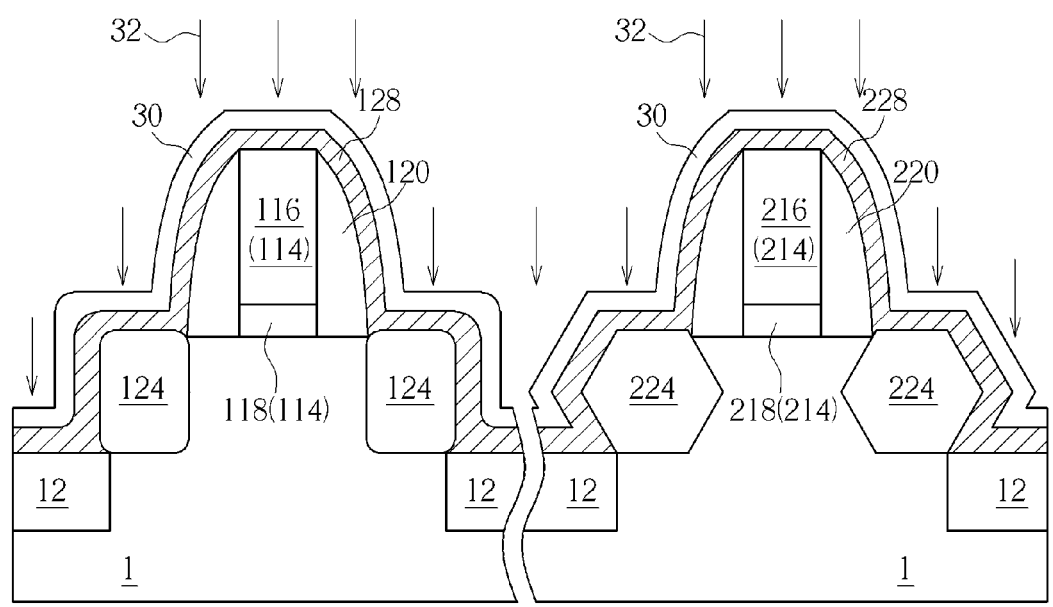
Figure 9:
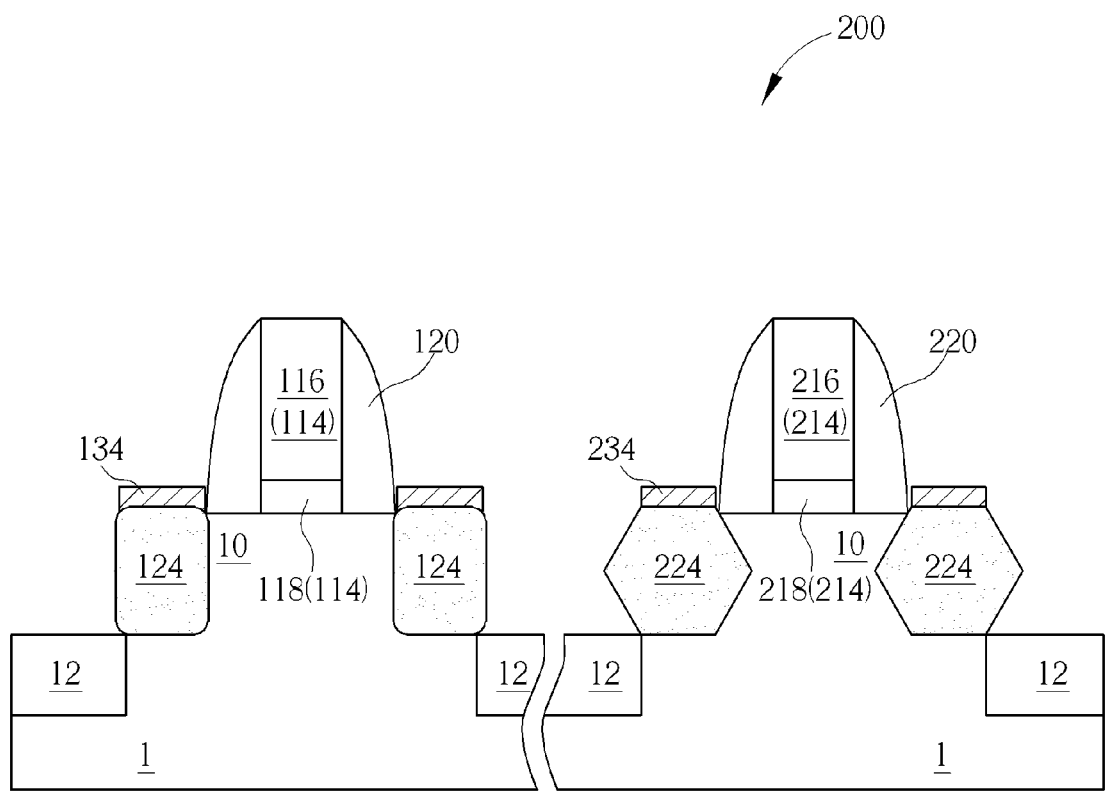

The fabricating method can also so be used to forma CMOS device. FIG. 7 to FIG. 9 depict a fabricating method of a strained CMOS device, wherein like reference numerals are used to refer to like elements throughout. The method of fabricating the PMOS or NMOS in the strained CMOS device is similar to the method of fabricating a strained FET illustrated in FIG. 1 to FIG. 6. FIG. 7 to FIG. 9 primarily depict the combination process of fabricating PMOS and NMOS.

As shown in FIG. 7, a semiconductive layer 10 is provided. The semiconductive layer 10 can be a fin or a planar substrate. The semiconductive layer 10 is divided into an NMOS region A and a PMOS region B. A first gate structure 114 is disposed on the semiconductive layer 10 within the NMOS region A. A second gate structure 214 is disposed on the semiconductive layer 10 within the PMOS region B. The second gate structure 214 includes a gate electrode 216 and a gate dielectric layer 218. A spacer 220 surrounds the second gate structure 214. Then, a first epitaxial layer 124 is formed to embed in the semiconductive layer 10 at two sides of the first gate structure 114 and within the NMOS region A. A second epitaxial layer 224 is formed to embed in the semiconductive layer 10 at two sides of the second gate structure 214 within the PMOS region B. The first epitaxial layer 124 may be SiC, SiCP or SiP. The second epitaxial layer may 224 be SiGe. The sequence of forming the first epitaxial layer 124 and the second epitaxial layer 224 can be exchanged. Then, a first element supply layer 128 is formed to cover the first epitaxial layer 124, and the first element supply layer 128 is only within the NMOS region A. Subsequently, a second element supply 228 layer is formed to cover the second epitaxial layer 224, and the second element supply layer 228 is only within the PMOS region B. The sequence of forming the first element supply layer 128 and the second element supply layer 228 can also be exchanged. The first element supply layer 128 may be C, SiC, SiCP or SiP. The second element supply layer 228 is SiGe, or Ge. The first element supply layer 128 and the first epitaxial layer 124 have at least one identical element besides silicon. The second element supply layer 228 and the second epitaxial layer 224 have at least one identical element besides silicon. In another example, the first element supply layer 128 and the second element supply layer 228 can be selectively formed on the first epitaxial layer 124 and the second epitaxial layer 224, respectively, by the process illustrated in FIG. 4B. The first element supply layer 128 and the second element supply layer 228, and the first element supply layer 128 and the second element supply layer 228 can be formed simultaneously in the same epitaxial growth process or by two different epitaxial growth processes.

As shown in FIG. 8, a cover layer 30 is formed on the first element supply layer 128 and the second element supply layer 228. The cover layer 30 may be $SiO_2$, SiN, TiN or SiCN. In other examples, the cover layer 30 can be omitted. Then, a thermal process 32 is performed on the first element supply layer 128 and the second element supply layer 228 to respectively drive the elements in the first element supply layer 128 and the second element supply layer 228 into the first epitaxial layer 124 and the second epitaxial layer 224. The thermal process 32 includes rapid thermal anneal, furnace anneal, condensation reaction or laser anneal.

As shown in FIG. 9, the cover layer 30, the first element supply layer 128 and the second element supply layer 228 are removed. A first source/drain doping region (shown by dots) and a second source/drain doping region (shown by dots) can be formed respectively in the NMOS region A and PMOS region B in sequence followed by an anneal process. In another example, the first source/drain doping region and the second source/drain doping region can be formed before the thermal process 32.

Later, a first cap layer 134 is formed on the first epitaxial layer 124. A second cap layer 234 is formed on the second epitaxial layer 224. At this point, a strained CMOS device 200 is completed.

The element supply layer used in the present invention contains at least one element the same as the epitaxial layer. Therefore, by using a thermal process, the element in the element supply layer can be driven into the epitaxial layer so as to increase the solid solubility of the element in the epitaxial layer. In this way, the stress in a channel of a strained FET can be increased.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A fabricating method of a strained FET, comprising
providing a semiconductive layer having a gate structure disposed thereon, wherein an epitaxial layer is embedded in the semiconductive layer beside the gate structure, wherein the semiconductive layer is made of at least one semiconductor material;
forming an element supply layer contacting the epitaxial layer, wherein the element supply layer and the epitaxial layer have at least one identical element besides silicon, wherein the strained FET is a NMOS, the element is C or P, the epitaxial layer comprises SiC or SiP, and the element supply layer comprises C, SiC, SiCP or SiP; and
performing a thermal process to drive the element within the element supply layer into the epitaxial layer, wherein the step of forming the element supply layer and the epitaxial layer having at least one identical element besides silicon is before the thermal process.

2. The fabricating method of a strained FET of claim 1, wherein the thermal process comprises rapid thermal anneal, furnace anneal, condensation reaction or laser anneal.

3. The fabricating method of a strained FET of claim 2, wherein the thermal process contains oxygen.

4. The fabricating method of a strained FET of claim 1, further comprising:
after the thermal process, removing the element supply layer; and
forming a cap layer on the epitaxial layer.

5. The fabricating method of a strained FET of claim 1, wherein the epitaxial layer is formed by the steps comprising:
forming a recess in the semiconductive layer beside the gate structure;
epitaxially growing the epitaxial layer to fill up the recess, wherein the epitaxial layer is crystallized.

6. The fabricating method of a strained FET of claim 1, wherein the semiconductive layer is a fin.

7. The fabricating method of a strained FET of claim 1, wherein the element supply layer is formed to cover the epitaxial layer, the gate structure and the semiconductive layer.

8. The fabricating method of a strained FET of claim 1, wherein the element supply layer is formed selectively to only cover the epitaxial layer.

9. The fabricating method of a strained FET of claim 1, further comprising before forming the element supply layer, implanting dopants into the epitaxial layer.

10. A fabricating method of a strained FET, comprising
providing a semiconductive layer having a gate structure disposed thereon, wherein an epitaxial layer is embedded in the semiconductive layer beside the gate structure, wherein the semiconductive layer is made of at least one semiconductor material;
forming an element supply layer contacting the epitaxial layer, wherein the element supply layer and the epitaxial layer have at least one identical element besides silicon;
forming a cover layer covering the element supply layer, wherein the cover layer comprises SiN, $SiO_2$, SiCN or TiN;
after forming the cover layer, performing a thermal process to drive the element within the element supply layer into the epitaxial layer, wherein the step of forming the element supply layer and the epitaxial layer having at least one identical element besides silicon is before the thermal process.

* * * * *